(12) United States Patent
Nicholls

(10) Patent No.: US 12,168,855 B2
(45) Date of Patent: Dec. 17, 2024

(54) REMOVABLE ACTIVE PANEL SYSTEM

(71) Applicant: Turf Alliance LLC, Welland (CA)

(72) Inventor: Mark H. Nicholls, Welland (CA)

(*) Notice: Subject to any disclaimer, the term of this patent is extended or adjusted under 35 U.S.C. 154(b) by 0 days.

(21) Appl. No.: 16/214,044

(22) Filed: Dec. 8, 2018

(65) Prior Publication Data
US 2019/0177922 A1 Jun. 13, 2019

Related U.S. Application Data

(60) Provisional application No. 62/596,717, filed on Dec. 8, 2017.

(51) Int. Cl.
| | | |
|---|---|---|
| *E01C 5/00* | (2006.01) | |
| *A46B 9/02* | (2006.01) | |
| *E01C 9/08* | (2006.01) | |
| *E01C 13/04* | (2006.01) | |
| *E01C 13/08* | (2006.01) | |
| *E04F 15/00* | (2006.01) | |

(Continued)

(52) U.S. Cl.
CPC ............... *E01C 5/001* (2013.01); *A46B 9/02* (2013.01); *E01C 9/08* (2013.01); *E01C 13/045* (2013.01); *E01C 13/08* (2013.01); *E04F 15/00* (2013.01); *H05K 9/00* (2013.01); *E01C 2013/006* (2013.01); *E01C 13/04* (2013.01); *E01C 15/00* (2013.01); *E04F 2290/00* (2013.01)

(58) Field of Classification Search
None
See application file for complete search history.

(56) References Cited

U.S. PATENT DOCUMENTS 5,752,357 A * 5/1998 Piller ................. A47G 27/0437
156/310
9,181,717 B1 * 11/2015 Jamison ................ E04F 15/206
(Continued)

FOREIGN PATENT DOCUMENTS

| EP | 0140868 A2 * | 5/1985 |
| EP | 0159865 A3 | 10/1985 |
| EP | 1705292 B1 | 9/2009 |

OTHER PUBLICATIONS

Peter Popp et al., "London 2012—Olympic Stadium", 2012, Magazine of Architecture + Construction Details, 16 pages. Accessed online on Oct. 15, 2020 at www.detail-online.com/article/london-2012-olympic-stadium-16402 (Year: 2012).*

(Continued)

*Primary Examiner* — Kim S. Horger
(74) *Attorney, Agent, or Firm* — Harter Secrest & Emery LLP

(57) ABSTRACT

A removable artificial turf panel system with an artificial turf panel that has a plurality of upstanding ribbons extending from a backing layer. An infill layer is interspersed between the upstanding ribbons on the backing layer. The outside of the backing layer may be provided with one of a magnet and a ferromagnetic material. The magnet/ferromagnetic material cooperates with a corresponding magnet/ferromagnetic material disposed in a channel on a layer of elastomeric material that supports the artificial turf panel. Accordingly, an artificial turf panel can be removably attached to a section of elastomeric material on an artificial turf playing surface.

11 Claims, 6 Drawing Sheets

(51) Int. Cl.
*H05K 9/00* (2006.01)
*E01C 13/00* (2006.01)
*E01C 15/00* (2006.01)

(56) References Cited

U.S. PATENT DOCUMENTS

| | | | | |
|---|---|---|---|---|
| 2004/0058096 | A1* | 3/2004 | Prevost | A01G 20/18 |
| | | | | 428/17 |
| 2005/0064112 | A1* | 3/2005 | Nicholls | A41G 1/009 |
| | | | | 428/17 |
| 2007/0237921 | A1* | 10/2007 | Knapp | D03D 27/00 |
| | | | | 428/92 |
| 2010/0058530 | A1* | 3/2010 | van Der Klooster | E04H 4/086 |
| | | | | 4/499 |
| 2012/0304580 | A1* | 12/2012 | Sha | E04F 13/0866 |
| | | | | 52/588.1 |
| 2016/0312414 | A1 | 10/2016 | Fowler et al. | |
| 2017/0037568 | A1* | 2/2017 | Love | D06N 7/0071 |

OTHER PUBLICATIONS

Wikipedia, "Barium ferrite", 2015, Wikipedia, 4 pages. Date determined by web.archive.org (Year: 2015).*

European Patent Office, International Search Report and Written Opinion from corresponding International Application No. PCT/US2018/064631, dated Feb. 26, 2019.

K&J Magnetics USA, "How Much Will a Magnet Hold?", article published on the world wide web at https:/www.kjmagnetics.com/blog.asp?p=how-much-will-a-magnet-hold, printed Jan. 7, 2021.

* cited by examiner

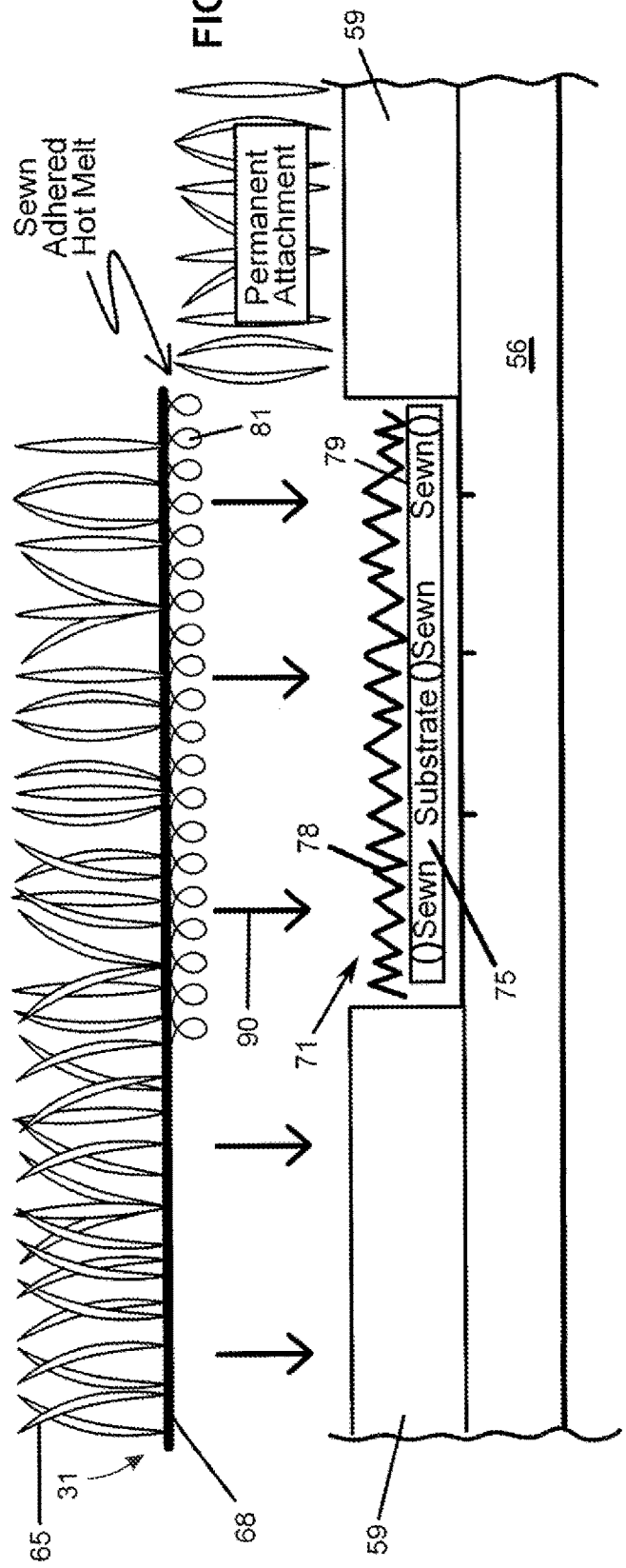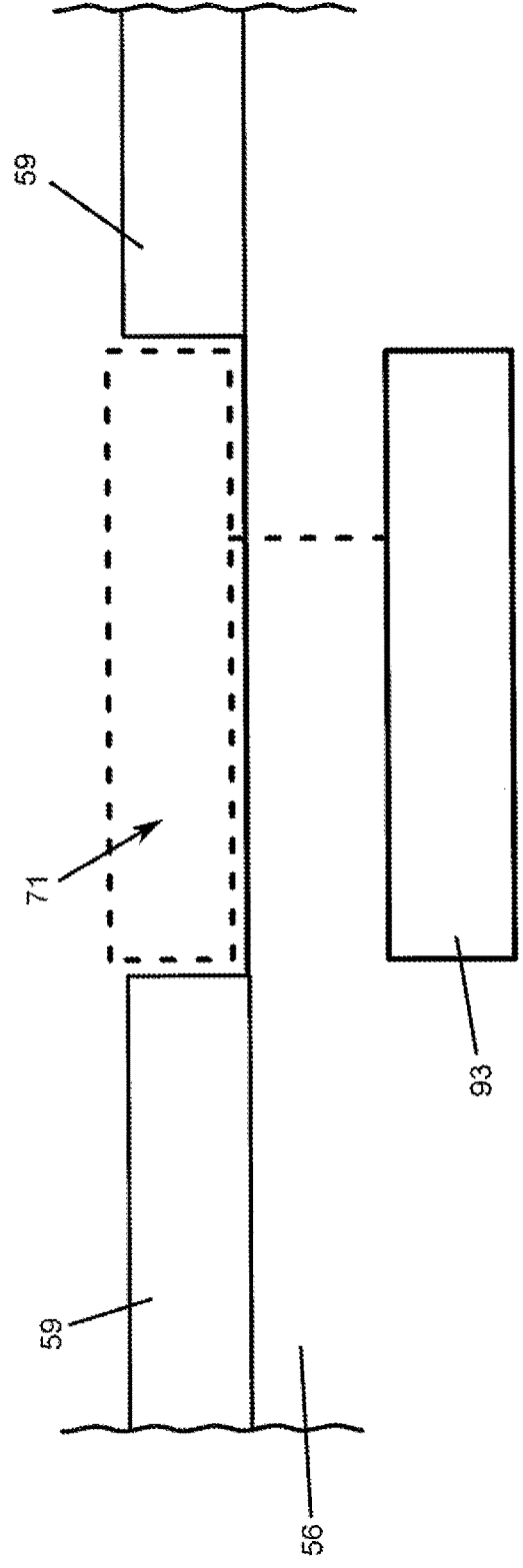

REMOVABLE ACTIVE PANEL SYSTEM

TECHNICAL FIELD

The present subject matter relates generally to the field of synthetic turf, and more particularly to a removable active panel system for use in connection with playing surfaces where sections of turf for athletic events may be exchanged or removed between events.

BACKGROUND ART

Artificial turf fields, pitches, and courts may be utilized in place of natural grass surfaces. An artificial turf field may comprise rows of synthetic ribbons that extend generally vertically from a backing layer. The synthetic ribbons may be designed to resemble grass. An infill layer of particulate material may be interspersed between the ribbons on the backing layer. In this arrangement, the synthetic ribbons are designed to extend a distance above the infill layer of particulate material. The infill may comprise, for example and without limitation, sand, rubber, a mixture of sand and rubber, or other granulated particles such as thermoplastic elastomers or rubbers, EPDM rubber, or cork. The infill of particulate material provides resiliency to the surface and helps keep the ribbons in an upright position.

Generally, the ribbons and backing of artificial turf known in the prior art is formed by tufting the ribbons through one or more layers of backing. The backing may comprise a single layer of material or multiple layers of material, and the individual layers may be woven and/or nonwoven material.

The tufting is generally performed using a conventional tufting machine analogous to a giant sewing machine with hundreds of needles. Multiple ends of yarn are fed to a bank of heavy needles with a typical span of twelve to fifteen feet. The tufting process involves passing a previously constructed primary backing under the needles and anchoring each stitch. The ribbons are thereby stitched into the backing fabric, leaving loops which form the turf pile. The pile may be loop pile, cut pile, or a combination of cut and loop introduced simultaneously in the turf by pushing off certain loops from the hook before they are cut.

Once the ribbons are tufted in place through the primary backing, a secondary backing may be applied to the primary backing.

BRIEF SUMMARY

With parenthetical reference to the corresponding parts, portions or surfaces of the disclosed embodiment, merely for the purposes of illustration and not by way of limitation, a removable active panel system is provided for installing removable artificial turf panels in a playing surface, the system comprising an artificial turf panel having a plurality of upstanding ribbons extending from a backing layer, at least a portion of the backing layer comprising at least one of a magnet and a ferromagnetic material, a support layer supporting the artificial turf panel and having a channel formed therein, the channel comprising at least one of a magnet and a ferromagnetic material, wherein the artificial turf panel is removably attached to the support layer by magnetic engagement of at least one of the magnet and ferromagnetic material of the artificial turf panel with the other of the at least one of the magnet and the ferromagnetic material of the support layer.

The panel may have an infill layer interspersed between the upstanding ribbons extending from the backing layer. The magnet may comprise a permanent magnet. The ferromagnetic material may comprise a permanent magnet. The magnet may comprise an electromagnet. The backing layer may comprise a primary backing layer and a secondary backing layer. The at least one of a magnet and a ferromagnetic material of the backing layer may comprise a magnetic additive in at least a portion of the secondary backing layer. The secondary backing layer may comprise urethane. The at least one of a magnet and a ferromagnetic material of the backing layer may comprise a permanent magnet fixed to at least a portion of the secondary backing layer. The support layer may comprise an elastomeric material. The support layer may comprise a layer of stone, concrete or asphalt disposed below the layer of elastomeric material. The support layer may comprise stone, concrete and/or asphalt.

BRIEF DESCRIPTION OF THE DRAWINGS

The accompanying drawings are incorporated herein as part of the specification. The drawings described herein illustrate embodiments of the presently disclosed subject matter and are illustrative of selected principles and teaching of the present disclosure and do not illustrate all possible implementations thereof. The drawings are not intended to limit the scope of the present disclosure in any way.

FIG. 4 is a schematic diagram depicting the installation of removable panels according to an embodiment of the present disclosure.

FIG. 5 is a top view of a schematic diagram depicting steps for forming a channel in an elastomeric layer according to an embodiment of the present disclosure.

DETAILED DESCRIPTION

Figure 1:
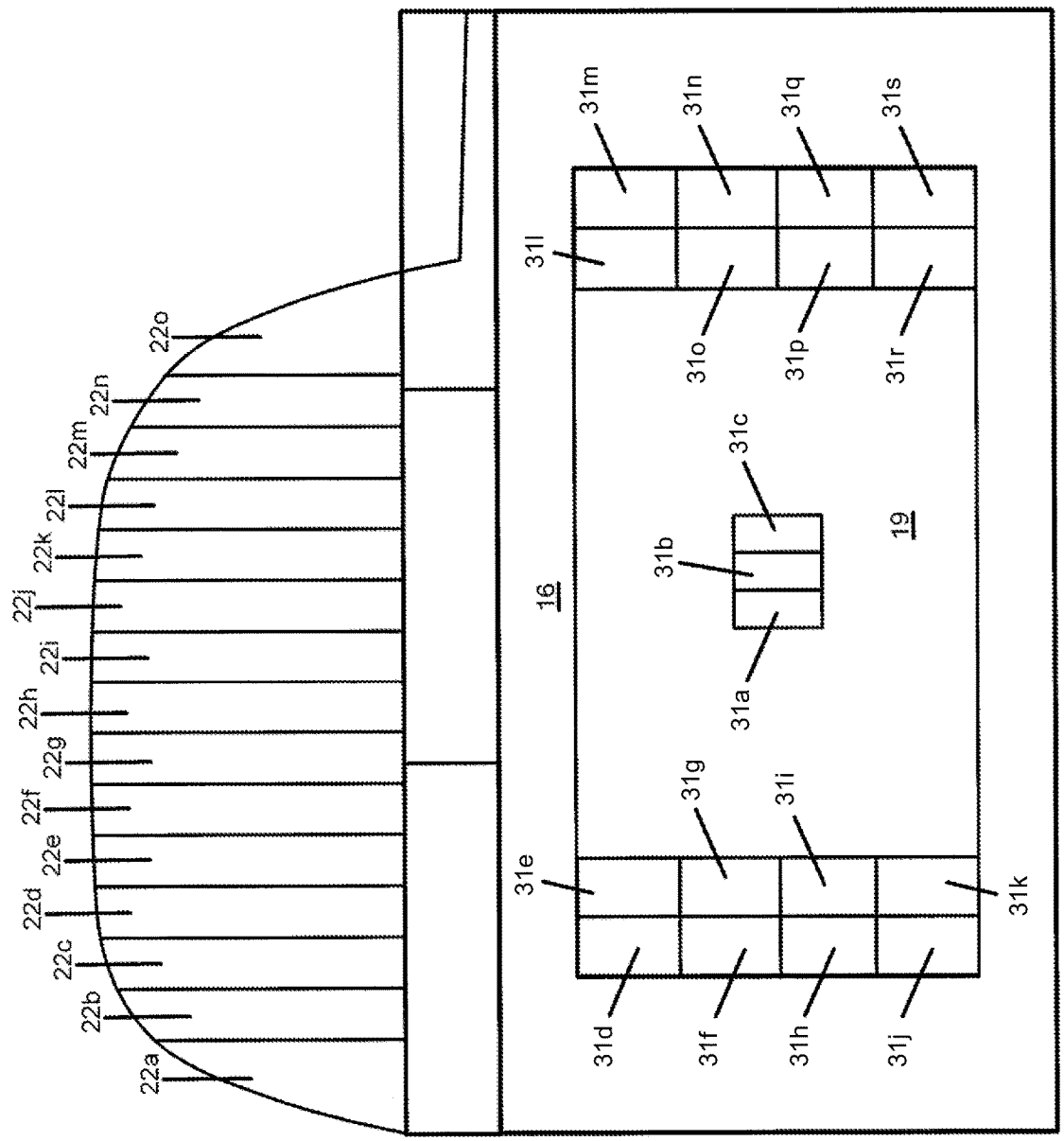
FIG. 1 is a plan view of a turf system having removable panels according to an embodiment of the present disclosure.

It is to be understood that like reference numerals are intended to identify the same structural elements, portions or surfaces consistently throughout the several drawing figures, as such elements, portions or surfaces may be further described or explained by the entire written specification, of which this detailed description is an integral part. Unless otherwise indicated, the drawings are intended to be read (e.g., cross-hatching, arrangement of parts, proportion, debris, etc.) together with the specification, and are to be considered a portion of the entire written description of the invention. As used in the following description, the terms "horizontal", "vertical", "left", "right", "up" and "down", as well as adjectival and adverbial derivatives thereof, (e.g., "horizontally", "rightwardly", "upwardly", etc.), simply refer to the orientation of the illustrated structure as the particular drawing figure faces the reader. Similarly, the terms "inwardly" and "outwardly" generally refer to the orientation of a surface relative to its axis of elongation, or of rotation, as appropriate.

Additionally, it is to be understood that the invention may assume various alternative orientations and step sequences, except where expressly specified to the contrary. Hence, specific dimensions, directions or other physical characteristics relating to the embodiments disclosed are not to be considered as limiting, unless expressly stated otherwise.

Referring now to FIG. 1, in an embodiment, a multipurpose artificial turf system 10 includes removable panels 31. The turf system 10 may include some areas of the turf that are permanently installed and some areas that comprise the removable panels 31. As illustrated in FIG. 1, in an embodiment, the turf system 10 may be installed to create an American football field. In an embodiment, removable panels 31 may be used to decorate special events or may be used for providing individual team logos where more than one team may share the venue for home games. Removable panels 31a, 31b, and 31c are located at midfield and may be used to depict logos related to the team, league, or to special events such as championships or all-star games. Removable panels 31d-k and removable panels 31l-s are located at opposite end zones. The surrounding turf 16 and the remainder of the field 19 are permanently installed. At the top of the figure, additional removable panels 22a-o are provided to convert the turf system 10 to a baseball field configuration. Other configurations for additional or alternative playing surfaces such as, without limitation, for a soccer field/ football pitch or rugby field, will be evident to those of ordinary skill in the art based on this disclosure.

Figure 2:
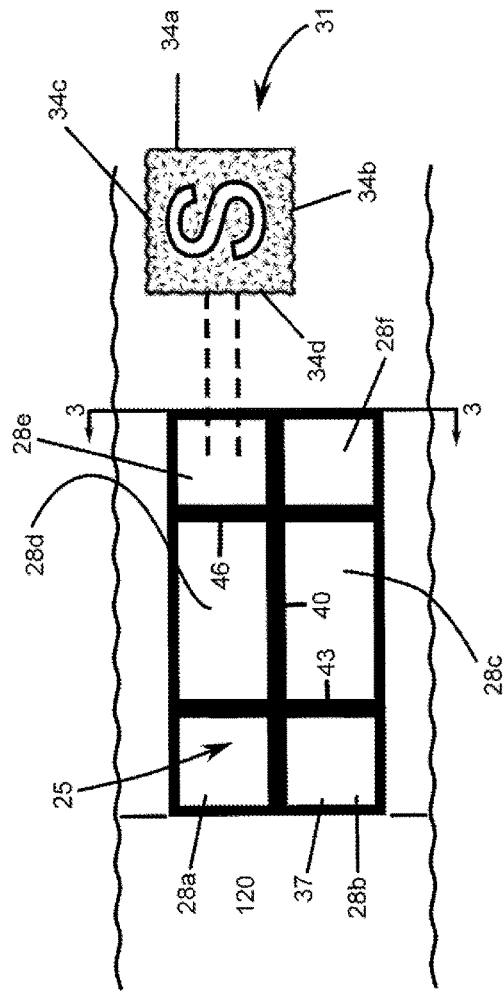
FIG. 2 is a plan view of an end zone schematic layout according to an embodiment of the present disclosure.

As illustrated in FIG. 2, in an embodiment, an American football field end zone portion 25 may be divided into six subsections 28a-f. In other embodiments, the end zone portion 25 may be divided into any number of sections as will be evident to persons of ordinary skill in the art based on this disclosure. In an embodiment, the end zone portion subsections 28a-f provide for attachment of removable panels 31 along their outside edges 34a-d. The end zone portion 25 has a border area 37 that extends around the periphery of the end zone portion 25. In an embodiment, the border area 37 may have a width between 2 inches and 6 inches. Interior seam areas 40, 43, and 46 extend between the sides of the border area 37. In an embodiment, the interior seam areas 40, 43, 46 may have a width of approximately twice the width of the border area 37.

Figure 3:
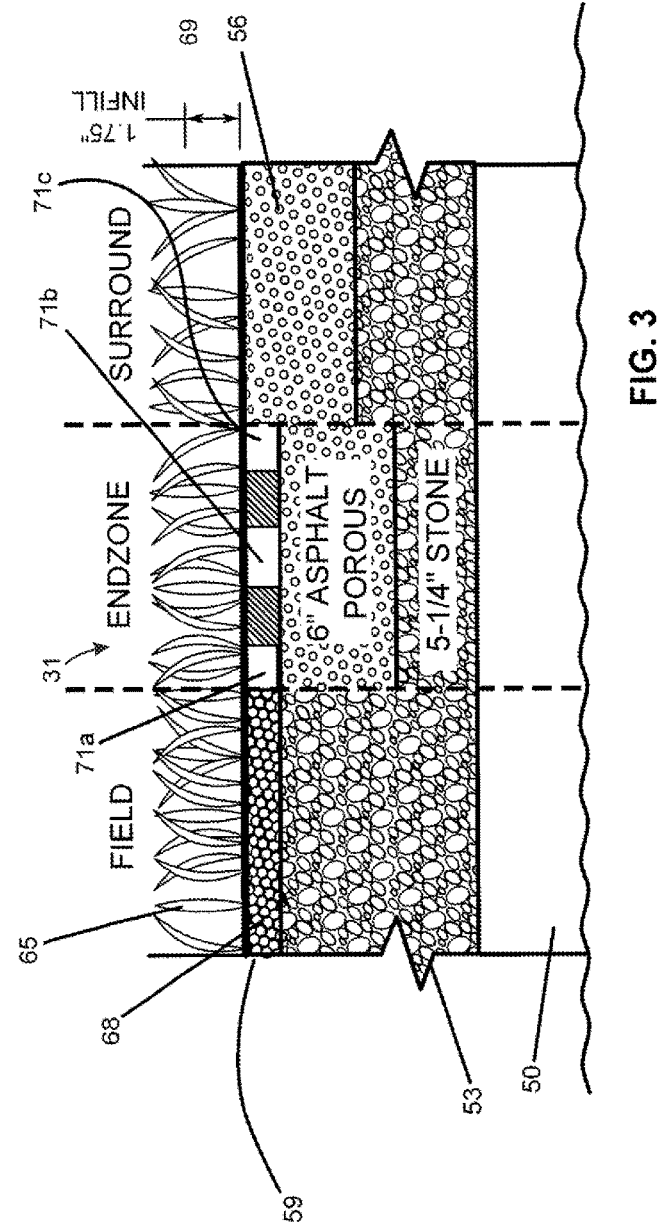
FIG. 3 is a cross-sectional view taken along lines 3-3 of FIG. 2.

As illustrated in FIG. 3, in an embodiment, the turf system 10 includes several supportive layers. In this embodiment, a first supportive layer 50 may comprise a concrete slab. The first supportive layer 50 may also be referred to as the base layer. A second supportive layer 53 may be provided on top of the concrete slab 50. In an embodiment, the second supportive layer 53 may comprise stone. The supportive layer 53 may be referred to as an intermediate layer. A third supportive layer 56 may be disposed on top of the second supportive layer 53. In an embodiment, the third supportive layer 56 may comprise a porous asphalt. A fourth supportive layer 59 of an elastomeric material may be provided on top of the stone and asphalt layers 53, 56, respectively. The additional supportive layers 53, 56, 59 above the concrete slab 50 provide for drainage and cushioning beneath the artificial turf system playing surface. While a multi-layer support system 50, 53, 56, 59 is shown and described, different numbers and/or types of layers may be used as alternatives without deviating from the present disclosure. For example, and without limitation, the base layer may comprise either porous or non-porous asphalt with a top cushioning elastomeric layer, or the base layer may comprise the only supportive layer beneath the artificial turf system playing surface.

A top layer 62 of the artificial turf system 10 is comprised of the artificial or synthetic turf. The top layer 62 includes turf fibers 65 on one side and a backing 68 on the opposite side. The backing 68 may be disposed directly onto the elastomeric layer 59. In an embodiment, the backing 68 may be permanently attached to the elastomeric layer 59 in certain areas of the field and may be removably coupled with the elastomeric layer 59 in other areas, such as at midfield and the end zones, as removable panels 31.

As illustrated in FIG. 2, in an embodiment, rails 120 may be disposed in the seam areas 40, 43, 46 and border areas 37 for supporting one or more trays of natural grass turf. The rails 120 may be disposed generally parallel to the seam areas 40, 43, 46 and border areas 37 in which they are located, respectively. In an embodiment, the rails 120 may comprise, but are not limited to, steel, aluminum, and/or alloy. One or more removable panels 31 may be removed and one or more trays of natural grass turf may be inserted/ supported on the rails 120.

The turf top layer 62 includes a primary backing layer 68 and a plurality of upstanding synthetic ribbons 65 representing blades of grass, extending upwardly from the upper surface of backing layer 68. In this embodiment, ribbons 65 are fibrillated slit-film and/or extruded polyethylene ribbons. Fibrillation means that the yarn is of a flat, tape-like character and includes longitudinally extending slits across its width. With light brushing, these slits tend to split along the slits into several individual free standing strands of a width that is thinner than the full width of the yarn and thereby more closely resembles blades of grass.

In an embodiment, an infill layer 69 may be provided above the top layer 62. The infill layer 69 may be interspersed between the upstanding ribbons 65 on the backing layer 68. In this arrangement, the synthetic ribbons 65 are designed to extend a distance above the infill layer 69. The infill layer 69 may comprise, without limitation, sand, rubber, a mixture of sand and rubber, and/or other granulated particles such as thermoplastic elastomers, rubbers, EPDM rubber, cork and/or organics. The infill layer 69 of particulate material provides resiliency to the top layer 62 and helps keep the ribbons 65 in an upright position.

Generally, the ribbons 65 and backing layer 68 are formed by tufting the ribbons 65 through one or more layers of backing 68. The backing 68 may comprise a single layer of material or multiple layers of material, and the individual layers may be woven and/or nonwoven material.

The tufting is generally performed using a conventional tufting machine, which is analogous to a giant sewing machine with hundreds of needles. Multiple ends of yarn are fed to a bank of heavy needles with a typical span of twelve to fifteen feet. The tufting process involves a previously constructed primary backing passing under the needles and anchoring each stitch. The ribbons 65 are thereby stitched into the backing fabric, leaving loops which form the turf pile. The pile may be loop pile, cut pile, or a combination of cut and loop introduced simultaneously in the backing 68 by pushing off certain loops from the hook before they are cut.

Once the ribbons 65 are tufted in place through the primary backing, the backing 68 is further coated on its back side with a urethane or latex coating, which may be referred to as a secondary backing, to help adhere the stitched ribbons 65 to the backing member 68 and to provide dimensional stability. In an embodiment, the secondary backing may include fiberglass disposed in the urethane or latex coating. The fiberglass in the secondary backing increases the stiffness of the backing layer 68.

Turning now to FIG. 3, in an embodiment, an infill layer 69 may be provided in the top layer 62. The infill layer 69 may be a mixture of rubber and sand particles interspersed between the upstanding ribbons 65 on the backing layer 68. In an embodiment, the synthetic ribbons 65 extend a length of about one (1) inch or greater from the upper surface of backing layer 68. The height of infill layer 69 may extend from about 50% to 80% the height of the ribbons 65, which means that ribbons 65 extend a distance of about 50% to 20% of their height above the top surface of the infill layer 69. In other embodiments, other ratios may be used as alternatives.

With continued reference to FIG. 3, in an embodiment, the end zone area may include three longitudinal channels 71*a-c* disposed in the elastomeric layer 59. Materials for engaging with the removable active panels 31 may be disposed in the three longitudinal channels 71*a-c*, as described in greater detail below. In other embodiments, the number and shape of the channels 71 may be varied as desired.

As illustrated in FIG. 5, in an embodiment, the elastomeric layer 59 may be disposed on top of the porous asphalt layer 56. In production of the artificial turf system 10, the elastomeric layer 59 may be applied to the porous asphalt layer 56 via a paving process as will be evident to those of ordinary skill in the art based on this disclosure. During the paving process, one or more channel forms 93 are positioned where longitudinal channels 71 are desired. In an embodiment, the forms 93 may be constructed of a sturdy lightweight material such as, but not limited to, aluminum. The forms 93 fill the space for the channels 71 to prevent elastomeric material 59 from entering the channel space during paving. After the elastomeric layer 59 dries and sets/cures, the forms 93 are removed. Alternatively, and without limitation, the layer 59 may be applied as a continuous flat surface and channels 71 may thereafter be cut, ground, or otherwise formed via a subtractive process into layer 59. At this stage of production, the channels 71 are longitudinal empty spaces located in the portion of the elastomeric material 59 defining the seam areas 40, 43, 46 and border areas 37 (see FIG. 2). The attachment of the removable turf panels 31 is described in greater detail below.

Figure 7:
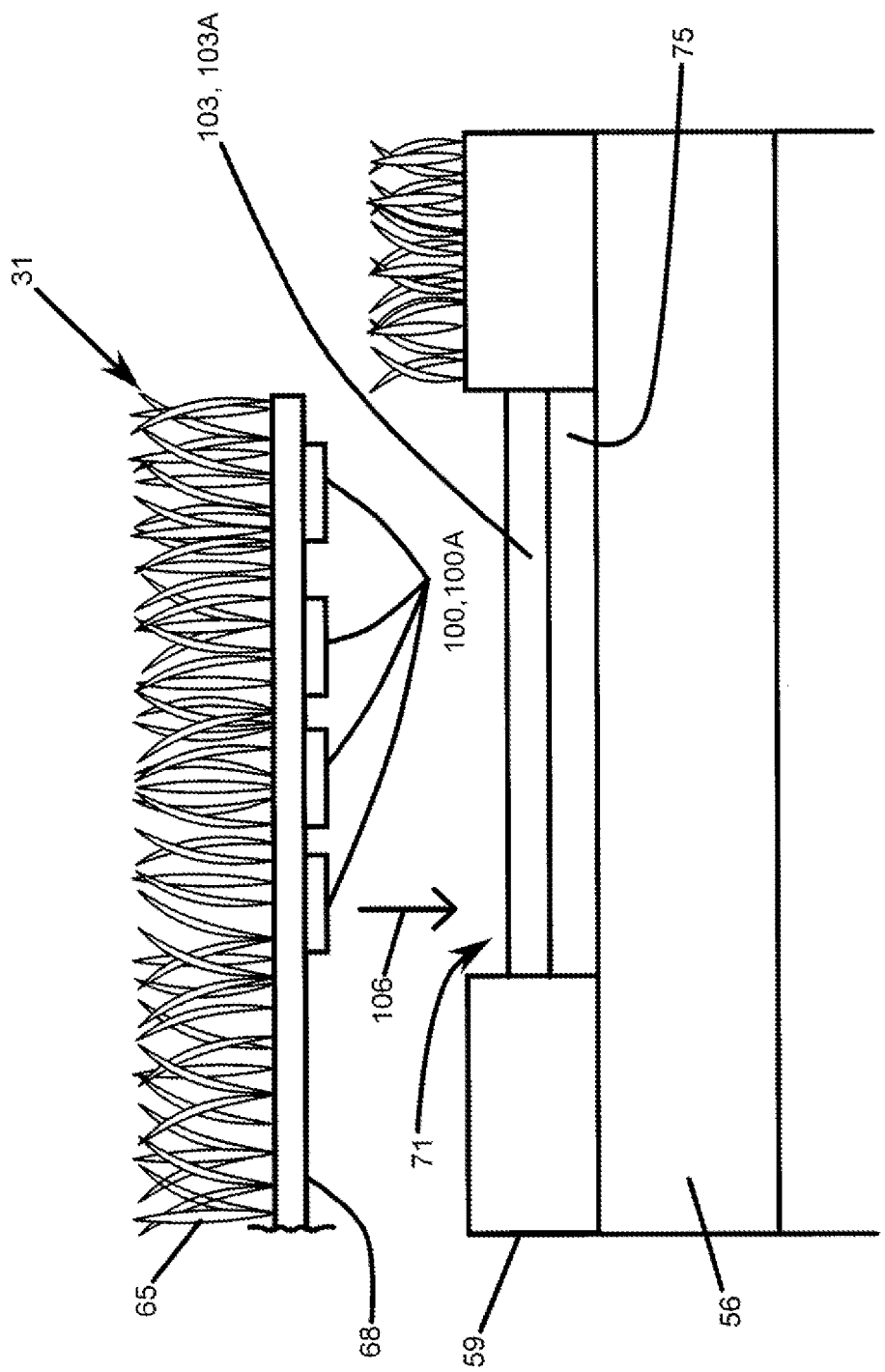
FIG. 7 is a schematic diagram depicting the installation of removable panels according to another embodiment of the present disclosure.

As illustrated in FIG. 7, in an embodiment, the removable turf panels 31 may include a plurality of bars 100 containing a ferromagnetic material such as iron or the like. The ferromagnetic bars 100 may be disposed in the backing layer 68 of the removable panel top layer 62. Alternatively, the ferromagnetic material may be formed as a unitary structure (not depicted). In an embodiment, the longitudinal channel 71 may be provided with a pad 75 for permanent attachment to the third supportive layer 56. In an embodiment, a permanent magnet 103 may be disposed on the pad 75 in the channel 71. As an alternative, the permanent magnet 103 may be disposed on the backing layer 68 of removable panel 31 and the ferromagnetic material may be disposed on the pad 75.

As another alternative, the backing layer 68 may be provided with a number of magnetic strips 100A and corresponding magnetic strips 103A may be provided on the pad 75 in the channels 71, or in the channels 71 without a pad 75. In an embodiment, the magnetic strips 100A, 103A may comprise flexible magnet sheets. The magnet sheets may include a ferromagnetic material integrated with a polymeric material or other flexible binder. In an embodiment, the magnetic strips 100A, 103A may be separated with a relatively small pull force normal to the field surface to facilitate efficient removal of the removable panels 31. However, to ensure that shear forces applied to the removable panels 31 during an athletic event do not cause shifting of the removable panels 31, the magnetic attraction between the magnetic strips 100A, 103A is greater in a plane parallel to the playing surface than in a plane normal to the playing surface. Thus, magnetic strips 100A, 103A have a magnetic attraction that provides improved dimensional stability parallel to the playing surface to prevent shear slip of the removable panel 31 relative to the multi-layer support system 50, 53, 56, 59.

In an embodiment, the inside surface of one or more of the magnetic strips 100A, 103A may have a high coefficient of friction material applied thereto. The high coefficient of friction material may include, but is not limited to, a polymeric material. In an embodiment, to prevent shear slip of the removable panels 31, a rough coating may be applied between the magnetic strips 100A, 103A.

When the panel 31 is aligned with the channel 71 and pushed down in the direction of arrow 106, the ferromagnetic material 100 and the permanent magnet 103 attract and provide a magnetic force to hold the panel 31 in position in the turf system 10. The magnetic bond is strong enough to hold the turf panel 31 securely in position, but may be manually separated during removal of the turf panel 31. As an alternative, the permanent magnet 103 may be replaced by an electromagnet which becomes magnetic when energized by an electrical current and/or the ferromagnetic material 100 may comprise permanent magnets.

Figure 8:
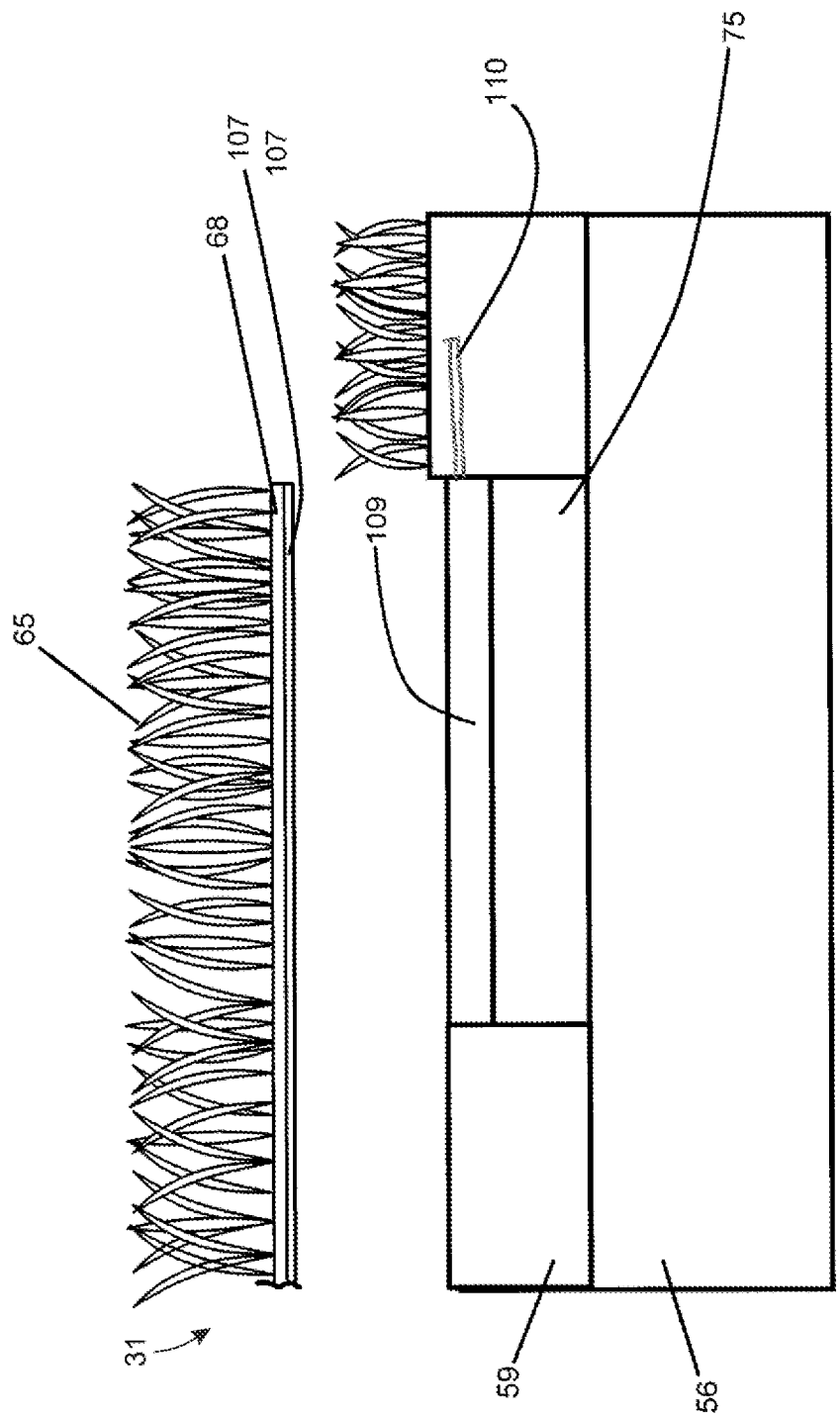
FIG. 8 is a schematic diagram depicting the installation of removable panels according to another embodiment of the present disclosure.

Turning to FIG. 8, an alternate embodiment is shown. In this embodiment the backing 68 of the turf panel is provided with an additional secondary layer 107 formed from a plastic or elastomeric resin or urethane containing a magnetic additive or a magnetic powder. In addition, or as an alternative, the primary backing 68 may be provided with a magnetic additive or magnetic powder. As illustrated in FIG. 8, the magnet for engaging with the ferromagnetic material in the backing 68 may be an electromagnet 109 provided with a current through an electrical circuit 110 connected thereto.

Turning now to FIG. 4, in an alternative embodiment, the attachment of the removable turf panels 31 may include a hook and loop system 78, 81. As illustrated in FIG. 4, a removable turf panel 31 is attached along edge 34*c* to the border area 37. The longitudinal channel 71*c* is provided with a pad 75 for permanent attachment to the sublayer. As shown, pad 75 is supported by the porous asphalt layer 56. Alternatively, the pad 75 may be supported by a different sublayer or a partial layer 59 of elastomeric material. The pad 75 may have a top surface 79 that is provided with a hook and loop fastening material 78. The pad 75 is constructed of any material suitable for attachment to a sublayer on one side and for attachment of the hook and loop fastening material 78 on the opposite side. The removable panel 31 may also be provided with hook and loop fastening material 81 disposed on the backing layer 68. The hook and loop fastening material 81 attaches to the corresponding hook and loop fastening material 78 when the panel 31 is positioned and a force is applied in the direction of arrow 90.

Figure 6:
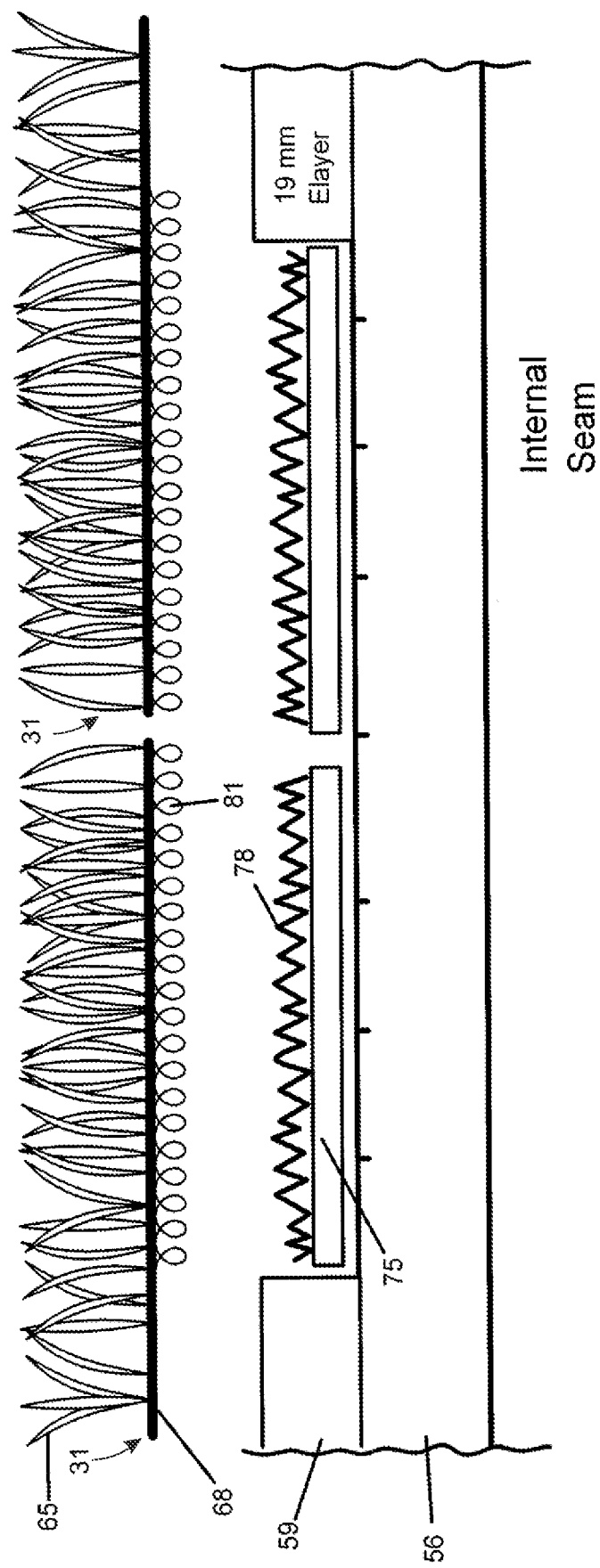
FIG. 6 is a schematic diagram depicting the formation of an internal seam according to an embodiment of the present disclosure.

Turning to FIG. 6, an internal seam such as located along interior seam area 40 (FIG. 2) is shown. The edges of two adjacent panels 31 are disposed adjacent to each other and removably attached by means of cooperating hook and loop fastening materials 78, 81.

One or more features of the embodiments described supra may be combined to create additional embodiments which are not depicted. The present invention contemplates that many changes and modifications may be made. Therefore, while the presently-preferred form of the removable active panel system has been shown and described, and several modifications and alternatives discussed, persons skilled in this art will readily appreciate that various additional changes and modifications may be made without departing from the scope of the invention.

What is claimed is:

1. A removable artificial turf panel system, comprising:
   a plurality of artificial turf panels comprising:
   a plurality of upstanding ribbons extending from a primary backing layer;
   an infill layer interspersed between the upstanding ribbons;
   a secondary backing layer connected to the primary backing layer, wherein the secondary backing layer is configured to at least partially secure the upstanding ribbons to the primary backing layer; and
   a ferromagnetic additive disposed within the secondary backing layer;
   a fixed support layer comprising an elastomeric material paved over a fixed asphalt layer and arranged to support the plurality of artificial turf panels, wherein the elastomeric material includes one or more channels;
   one or more pads disposed within the one or more channels and fixed to the elastomeric material;
   one or more magnets arranged at least partially within the one or more channels; and
   wherein the plurality of artificial turf panels are removably attached to the support layer by engagement of the one or more magnets and the secondary backing layer,
   wherein at least one edge of one or more of the plurality of artificial turf panels is arranged adjacent to fixed artificial turf, wherein one or more of the plurality of artificial turf panels are removable without removing each of the plurality of artificial turf panels or the fixed artificial turf,
   wherein the one or more magnets and the secondary backing layer are at least partially in contact, and
   wherein the one or more magnets and the ferromagnetic additive are configured such that a force required to disengage the one or more magnets and the secondary backing layer is less than a force required to move the one or more magnets and the secondary backing layer relative to one another in a plane parallel to the secondary backing layer.

2. The artificial turf panel system of claim 1, wherein the one or more magnets comprises a permanent magnet.

3. The artificial turf panel system of claim 1, wherein the one or more magnets comprises an electromagnet.

4. The artificial turf panel system of claim 2, wherein the one or more magnets comprises sheet magnets.

5. The artificial turf panel system of claim 1, wherein the secondary backing layer comprises urethane or latex.

6. The artificial turf panel system of claim 1, wherein the support layer comprises one of a layer of stone, concrete and asphalt disposed below the layer of elastomeric material.

7. The artificial turf panel system of claim 1, wherein the support layer comprises stone, concrete and asphalt.

8. The artificial turf panel system of claim 1, further comprising a polymeric material layer connected to the one or more magnets, wherein the polymeric material is arranged between the secondary backing layer and the one or more magnets.

9. A method of installing a removable artificial turf panel, the method comprising:
   a) providing a layer of stone;
   b) providing a fixed layer of porous asphalt on top of the layer of stone;
   c) providing a fixed support layer comprising an elastomeric material paved over the layer of porous asphalt, the elastomeric material having at least one channel formed therein, and one or more pads disposed within the one or more channels and fixed to the elastomeric material;
   d) providing a plurality of artificial turf panels having a plurality of upstanding ribbons extending from a primary backing layer and an infill layer interspersed between the upstanding ribbons;
   e) providing a secondary backing layer connected to the primary backing layer, wherein the secondary backing layer is configured to at least partially secure the upstanding ribbons to the primary backing layer;
   f) providing one or more magnets arranged at least partially within the one or more channels, and a ferromagnetic additive disposed within the secondary backing layer;
   g) locating the plurality of artificial turf panels on the support layer and magnetically engaging the one or more magnets and the secondary backing layer, wherein the one or more magnets and the secondary backing layer are at least partially in contact, and wherein the one or more magnets and the ferromagnetic additive are configured such that a force required to disengage the one or more magnets and the secondary backing layer is less than a force required to move the one or more magnets and the secondary backing layer relative to one another in a plane parallel to the secondary backing layer,
   wherein at least one edge of one or more of the plurality of artificial turf panels is arranged adjacent to fixed artificial turf, wherein one or more of the plurality of artificial turf panels are removable without removing each of the plurality of artificial turf panels or the fixed artificial turf.

10. The method of claim 9, further comprising a pad attached to the elastomeric layer inside the at least one channel.

11. The method of claim 10, wherein the at least one channel is created by a form arranged on the porous asphalt layer during application of the support layer.

* * * * *